United States Patent [19]

Taylor et al.

[11] 4,230,674
[45] Oct. 28, 1980

[54] CRUCIBLE-DIE ASSEMBLIES FOR GROWING CRYSTALLINE BODIES OF SELECTED SHAPES

[75] Inventors: Aaron S. Taylor, Acton, Mass.; Richard W. Stormont, Warwick, R.I.

[73] Assignee: Mobil Tyco Solar Energy Corporation, Waltham, Mass.

[21] Appl. No.: 754,422

[22] Filed: Dec. 27, 1976

[51] Int. Cl.² .............................................. C30B 15/34
[52] U.S. Cl. ......................... 422/246; 156/DIG. 88; 156/DIG. 83; 422/249
[58] Field of Search ......... 156/608, 617 SP, DIG. 88, 156/DIG. 69, DIG. 83; 23/273 SP; 422/246, 249

[56] References Cited

U.S. PATENT DOCUMENTS

| | | | |
|---|---|---|---|
| 2,977,258 | 3/1961 | Dunkle | 156/617SP |
| 3,190,732 | 6/1965 | Hamilton | 156/DIG. 64 |
| 3,241,925 | 3/1966 | Cakenberghe | 156/617 SP |
| 3,359,077 | 12/1967 | Arst | 156/DIG. 64 |
| 3,687,633 | 8/1972 | LaBelle, Jr. | 156/608 |
| 3,953,174 | 4/1976 | LaBelle, Jr. | 156/608 |
| 3,961,905 | 6/1976 | Rice | 156/608 |

FOREIGN PATENT DOCUMENTS 1011973 12/1965 United Kingdom ..................... 156/608

Primary Examiner—Hiram H. Bernstein
Attorney, Agent, or Firm—Schiller & Pandiscio

[57] ABSTRACT

The invention is an improved apparatus for use in a system for growing crystalline bodies from the melt. The apparatus is a novel crucible-die in which the crucible forms an integral part of the die.

11 Claims, 7 Drawing Figures

CRUCIBLE-DIE ASSEMBLIES FOR GROWING CRYSTALLINE BODIES OF SELECTED SHAPES

This invention relates to apparatus for growing crystalline bodies from the melt and more particularly to novel crucible and die arrangements for growing relatively large diameter crystalline bodies from the melt.

Various systems have been developed for growing crystalline bodies from the melt. The present invention pertains to an improvement in growing crystalline bodies from a melt according to what is called the edge-defined, film-fed, growth technique (also commonly known as the EFG Process). Details of the EFG Process are described in U.S. Pat. No. 3,591,348 issued July 6, 1971, to Harold E. LaBelle, Jr., for Method of Growing Crystalline Materials, and U.S. Pat. No. 3,687,633, issued Aug. 29, 1972, to Harold E. LaBelle, Jr., et al for Apparatus for Growing Crystalline Bodies From the Melt.

In the EFG Process the shape of the crystalline body is determined by the external or edge configuration of the end of a capillary forming member which for want of a better name is called a die. An advantage of the process is that bodies of selected shapes such as round tubes can be produced commencing with the simplest of seed geometries, namely, a round small diameter seed crystal. This process involves growth on a seed from a liquid film of feed material sandwiched between the growing body and the end surface of the die, with the liquid in the film being continuously replenished from a suitable melt reservoir via one or more capillaries in the die member. Among the materials that have been grown by the EFG Process as monocrystalline bodies are alpha-alumina (sapphire), spinel, chrysoberyl, barium titanate, lithium niobate, yttrium aluminum garnet and silicon.

Essential requirements of the EFG Process are that the crucible and die member be made of a composition that will withstand the operating temperatures and will not react with the melt. Also, the die member must be wettable by the melt and the dies and crucibles should be made of a material that will not dissolve in the melt. By way of example, the dies and crucibles used in growing monocrystalline alumina bodies generally are made of molybdenum or tungsten, while in growing monocrystalline silicon bodies from the melt, the dies generally are made of graphite and the crucibles generally are made of graphite or quartz. However, molybdenum and tungsten have a small but finite solubility in molten alumina, and, therefore, the longer the crystal growing process proceeds without interruption, the more likely that die and/or crucible material will dissolve in the melt and thereby affect the growth process. A similar dissolution problem exists in the case of graphite or quartz dies and crucibles in contact with molten silicon. Moreover, any impurities present in the crucible and/or die material may also be leached out of the material and become included in the growing crystal.

The primary object of the present invention is thus to provide an improved apparatus for growing crystalline bodies from the melt.

Other objects are to provide a novel die and crucible for growing crystalline bodies from the melt by the EFG Process whereby the rate and quantity of dissolution of crucible and/or die material into the melt is reduced as compared with prior crucible-die assemblies.

One approach of reducing the problem of dissolution of crucible and/or die material is described in U.S. Pat. No. 3,953,174, issued Apr. 27, 1976, to Harold E. LaBelle, Jr., for Apparatus for Growing Crystalline Bodies from the Melt. In that patent, LaBelle describes a novel crucible-die assembly in which the dies are located in cavities formed in the crucible side-wall. LaBelle reports the problem of dissolution of crucible and/or die material into the melt to be a temperature dependent phenomena due to the fact that the interior surfaces of the crucible walls in the then known EFG systems are at a higher temperature than the die members. As a result, crucible material tends to dissolve from the crucible walls only to precipitate on surfaces of the cooler die member. In U.S. Pat. No. 3,953,174, LaBelle proposes to solve the dissolution problem by locating the die members in cavities in the crucible side walls.

The present invention is based on the realization that the rate of dissolution of crucible and/or die material into the melt is also dependent on the area of the crucible and die/melt interface, and on the volume of material which is used to form the crucible and die. Accordingly, the present invention, whereby the foregoing objects are achieved, provides a novel crucible and die arrangement which has the three-fold effect of (1) minimizing the crucible- and die/melt interface area, (2) minimizing the volume of material which is used to form the crucible and die, and (3) effectively maintaining the crucible and die substantially at the same temperature. Briefly described, the present invention provides a crucible and die in which the crucible also forms an integral part of the die. The invention has two basic embodiments. In one basic embodiment the crucible and die comprise a single member with the die being formed integrally with the crucible. The crucible comprises a member having a bottom wall and a tubular side wall which define an interior melt-containing space. The die essentially is defined by an annular cavity formed in the upper end of the side wall, and one or more capillary passageways are provided in the side wall, with each passageway having one end communicating with the interior space, and the other end terminating in the cavity. In the other basic and preferred embodiment of the invention, the crucible and die comprise two discrete members in cooperating relationship. A first crucible member has a bottom wall and a tubular side wall which define an interior space. A second die-completing liner member is supported interiorly of the crucible member in space relation to the crucible side wall so that the crucible member side wall forms the outside section of the die and the second member forms the inner section of the die, with capillary passageways being formed by the interspace between the crucible and liner members.

Other features and many of the attendant advantages of this invention are set forth or rendered obvious by the following detailed description which is to be taken together with the accompanying drawings wherein like numerals depict like parts, and wherein.

Crucible and die assemblies may be made in accordance with the present invention for use in producing monocrystalline bodies of a variety of shapes. However, the particular embodiments shown are particularly adapted for producing relatively large diameter cylindrical tubes from any one of a variety of congruently melting materials that solidify in identifiable crystal lattices. By appropriately selecting the materials of which they are constructed, crucible and die combinations provided in accordance with this invention may be used to grow crystalline bodies of, for example, alumina, barium titanate, lithium niobate, yttrium aluminum garnet or silicon. The invention is also applicable to growth of other materials such as eutectic compositions. For convenience, the following detailed description of the invention is directed to crucible/die combinations for growing relatively large diameter substantially monocrystalline tubes of silicon, although it is not intended that the invention be so limited.

Figure 1:
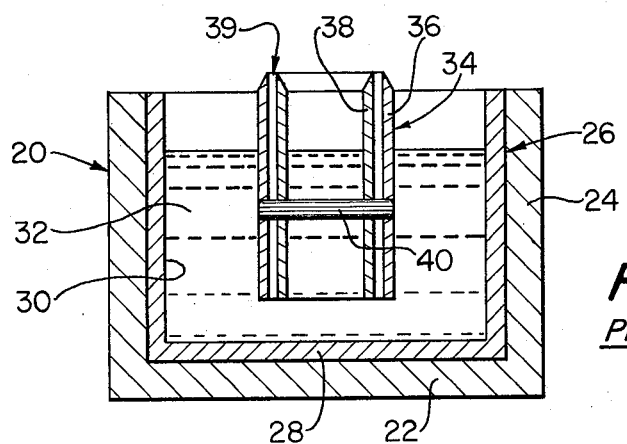
FIG. 1 is a side elevation, partly in section, of portions of a typical prior art crucible and die assembly for growing tubular bodies from the melt.

FIG. 1 shows a typical prior art form of crucible-die assembly for growing tubes of silicon. The illustrated assembly comprises a cylindrical heat susceptor 20 which is made of molybdenum or graphite. Susceptor 20 is open at its top end and includes a bottom wall 22 and a cylindrical side wall 24. Disposed within susceptor 20 is a cylindrical quartz or graphite crucible 26. The crucible 26 is also open at its top end and comprises a bottom wall 28 and a side wall 30 which together define an interior space for containing a melt 32 of the material to be grown, i.e. silicon. The susceptor and crucible are mounted in a suitable crystal growing furnace, e.g. a furnace of the type shown in FIG. 1 of U.S. Pat. No. 3,591,348, supra.

Located within the crucible 26 is a die assembly 34 consisting of two concentric cylindrical graphite sleeves 36 and 38. Suitable means (not shown) are used to support the die assembly in the crucible. Sleeve 36 has an inside diameter greater than the outside diameter of the inner tube or sleeve 38, so as to provide a gap 39 therebetween of capillary proportions. Tube 36 is spaced from tube 38 and is held in concentric relation therewith by suitable means (not shown) as, for example, by a plurality of spaces in the form of small diameter wires or rods in the manner shown in FIG. 2 of U.S. Pat. No. 3,687,633, issued Aug. 29, 1972, to Harold E. LaBelle, Jr. and Charles J. Cronan, and the two tubes are locked together in spaced relationship by one or more pins 40 which extend through suitable openings formed in the two tubes. Further details of crucible-die assemblies of the type shown in FIG. 1 and of various other types of crucible-die assemblies are given in U.S. Pat. No. 3,687,633, supra.

Figure 2:
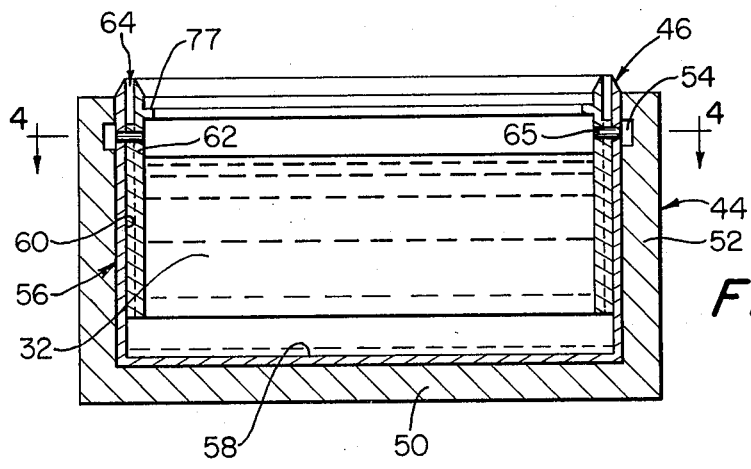
FIG. 2 is a side elevation, partly in section of one form of crucible and die in accordance with the present invention, disposed in a heat susceptor.

FIG. 2 shows one form of crucible and die constructed in accordance with the present invention. Although not shown, it is to be understood that the crucible and die assembly shown in FIG. 2 will be installed in a crystal growing furnace in known manner.

The apparatus shown in FIG. 2 comprises a molybdenum or graphite heat susceptor 44 and a crucible and die assembly indicated generally at 46. Heat susceptor 44 is open at its top end and comprises a bottom wall 50 and a cylindrical side wall 52. The purpose of cavities 54 will become clear from the description following.

Crucible and die assembly 46 is mounted interiorly of heat susceptor 44. Crucible and die assembly 46 comprises basically two discrete members 56 and 62 which for want of better names are called the crucible member and the liner member respectively. However, it will be understood from the description following that the crucible member also serves as an essential part of an EFG die which is not complete without the associated liner member. Crucible member 56 is of conventional design and is open at its top end and has a bottom wall 58 and a cylindrical side wall 60. Crucible member 56 is made of graphite and is sized so as to fit snugly within heat susceptor 44.

Disposed within crucible member 56 is a die-completing liner member which is in the form of a cylindrical sleeve or tube 62 and is also made of graphite. Sleeve 62 has an outer diameter which is slightly smaller then the inside diamtere of crucible member 56, so as to provide a gap 64 therebetween of capillary proportions. Sleeve 62 is spaced from the crucible side wall 60 by a plurality of spacers 63 (FIGS. 3 and 4) which preferably are ribs formed by machining grooves into the outer wall surface of die member 62, and the crucible and die are held in concentric relation by a plurality of rivets or pins 65 which extend through suitable openings formed through the crucible side wall 60 and sleeve 62. The upper end of crucible side wall 60 and the upper end of sleeve 62 are bevelled from a high point at the capillary gap 64 so as to form a pair of parallel end edge surfaces 74 formed at the intersection of inclined surfaces 76 with capillary gap 64. Edge surfaces 74 are substantially flush with one another and extend above the upper end of heat susceptor 44. Surfaces 74 may be substantially knife edges as shown or may have a more substantial width as would be produced by truncating the upper end of the die along a plane as represented by dotted line 75.

As seen in FIG. 2 crucible side wall 60 is somewhat longer than sleeve 62 so that the bottom of sleeve 62 will be spaced from the bottom wall 58 of the crucible when the crucible and liner members are assembled with their upper edge surfaces 74 flush with one another. One skilled in the art will recognize that this space permits melt to flow into the bottom end of capillary gap 64. Alternatively one or more slots may be cut through the lower portion of sleeve 62 for permitting melt flow into capillary gap 64.

Although not required, it is preferred that blind holes or spaces 54 be provided in the inner surface of the susceptor side wall 52, adjacent pins 65. Holes 54 should be of a sufficient size so as to provide a clear space for collection of any melt that may leak past pins 65. For ease of manufacture and also to facilitate assembly, space 54 may take the form of an annular slot formed in the inner surface and extending for the full circumference of the crucible side wall 52.

One skilled in the art will recognize that with the above described arrangement, crucible member 56 together with liner member 62 define an EFG die having a capillary opening in the form of a gap 64 and die-defining edge surfaces 74 which may be used to grow monocrystalline silicon tubes with controlled inner and outer diameters. Completing the crucible and die shown in FIG. 2 is a flange 77 formed on the inner wall surface of die member 62 adjacent the upper end thereof. Flange 77 is used to support a heat shield and melt cover (not shown) in known manner.

The arrangement in FIG. 2 offers a number of advantages over the prior art die and crucible assembly illustrated in FIG. 1. For one thing, it comprises fewer parts then the prior art die and crucible assembly. Another advantage of the present invention resides in the fact that the side wall of crucible 56 comprises an integral part of the die. As a result the melt in the capillaries will be substantially at the temperature of the crucible. Thus, the possibility of dissolving crucible material in the melt and precipitating the dissolved material in the capillaries is reduced. Still another advantage of the present invention is that crucible and die material volume, and melt/crucible and melt/die interfacial surface areas are reduced as compared with prior art die and crucible assemblies. This results in a corresponding reduction in the amount of potential impurities and in the area of potential sources of contamination. For example, a die and crucible assembly of the prior art type as shown in FIG. 1 comprises three principal parts and has six interfacial surface of roughly equivalent area which are potential sources of melt contamination. On the other hand, the die and crucible constructed as in FIG. 2 comprise only two principal parts, and has only four potential contaminate interfacial surfaces of roughly equivalent area. Assuming that all parts in each assembly are formed as thin as possible, one skilled in the art will recognize that the volume of material in the crucible and die constructed as in FIG. 2 also is substantially less than the prior art die and crucible as shown in FIG. 1. One skilled in the art will recognize another advantage of the present invention in the ability to better control die temperatures.

Figure 5:
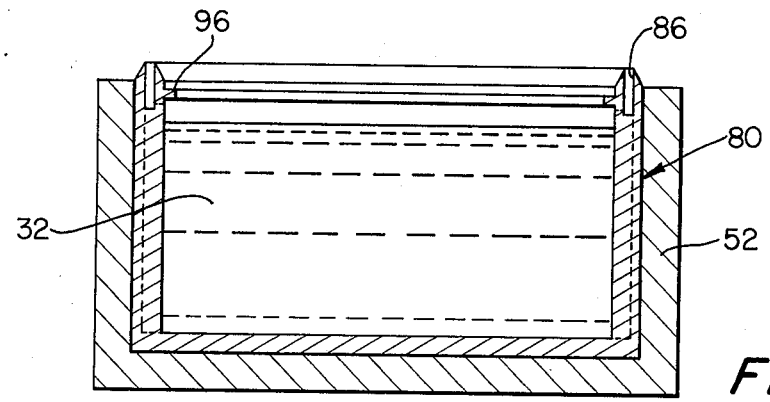
FIG. 5 is a sectional view in side elevation showing a second form of crucible and die in accordance with the present invention, disposed in a heat susceptor.
Figure 6:
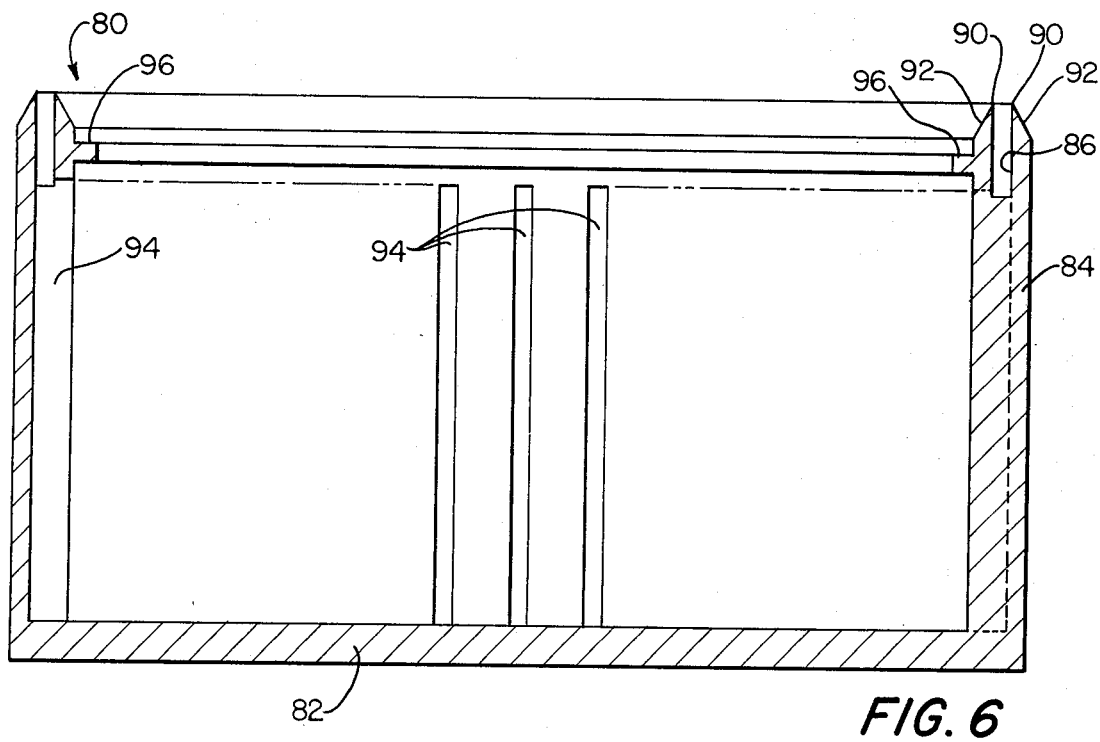
FIG. 6 is a sectional view in side elevation on an enlarged scale of the crucible and die of FIG. 5.
Figure 7:
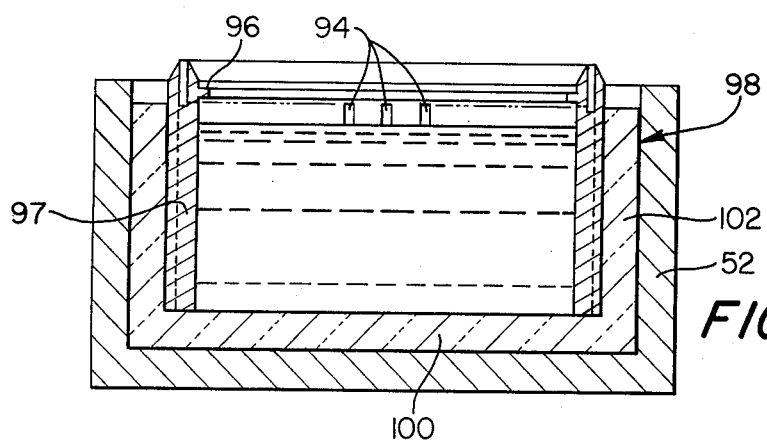
FIG. 7 is a side elevation, partly in section, showing a third form of crucible and die in accordance with the present invention, disposed in a heat susceptor.

FIGS. 5-7 show other forms of dies and crucibles in accordance with the present invention. The crucible and die arrangement illustrated in FIGS. 5 and 6 consists of a single discrete graphite member 80 which serves as both the crucible and the die. Member 80 is in the form of an upright cylinder open at its top and comprising a bottom wall 82 and a cylindrical side wall 84. Side wall 84 has an outer diameter of dimension so as to fit snugly within supporting heat susceptor 52 and walls 84 extend slightly beyond the top of the susceptor 52. An annular cavity or slot 86 of capillary dimension is formed in and extends circumferentially for the full length of the top end surface of the crucible side wall 84, and the upper end of wall 84 is bevelled on opposite sides from a high point at capillary slot 86 so as to form a pair of parallel end edge surfaces 90 formed by the intersection of inclined surfaces 92 with capillary slot 86 (see FIG. 6).

As best seen in FIG. 6, a plurality of elongate slots 94 are formed on the inside surface of cylindrical side wall 84. Each slot 94 extends from the lower inside edge of wall 84 to a point where it intersects annular slot 86. The width of slots 94, i.e., the horizontal dimension as seen in FIG. 6, is of a capillary size so that they can function to supply melt to annular slot 86 by action of capillary rise. Obviously, slots 94 need not be rectangular in cross-section but may have some other shape in cross section, e.g. trapezodial.

Completing the arrangement shown in FIGS. 5 and 6 is a flange 96 formed on the upper end of the inside surface of wall 84 for supporting a circular combined heat shield and melt cover (not shown) in known manner. Flange 96 is disposed below the upper end of wall 84.

The crucible and die arrangement shown in FIG. 5 and 6 has an advantage of reducing to a single discrete part the number of parts required for forming a crucible and die. Moreover, with the arrangement illustrated in FIGS. 5 and 6, the interfacial potential contaminate surface area of die and crucible exposed to the melt, and also the volume of material used to form the die and crucible are also further reduced as compared with the prior art die and crucible assemblies.

The crucible and die shown in FIG. 7 is similar to the crucible and die shown in FIGS. 5 and 6 except that in the FIG. 7 arrangement the crucible has the form of an open ended graphite cylinder 97. The crucible is disposed within a quartz container 98 which includes a circular bottom 100 and a cylindrical side wall 102. Container 98 in turn is disposed within a molybdenum susceptor 52. Crucible 97, container 98 and susceptor 52 are sized relative to one another so that the three pieces can be assembled snugly as shown in FIG. 7. Crucible 97 and container 98 are sized to fit snugly together. While the crucible and die arrangement shown in FIG. 7 increases the number of principal parts as compared with the crucible and die arrangement of FIGS. 5 and 6, in the FIG. 7 arrangement the bottom of the graphite crucible is closed off by a quartz wall which has an advantage in that the rate at which impurities in quartz may be leached by molten silicon typically is substantially lower than the rate of leaching of impurities from graphite under similar conditions. Thus the amount of impurities included in a growing crystal may be further reduced.

The following example illustrates a preferred mode of practising the invention.

EXAMPLE

Figure 4:
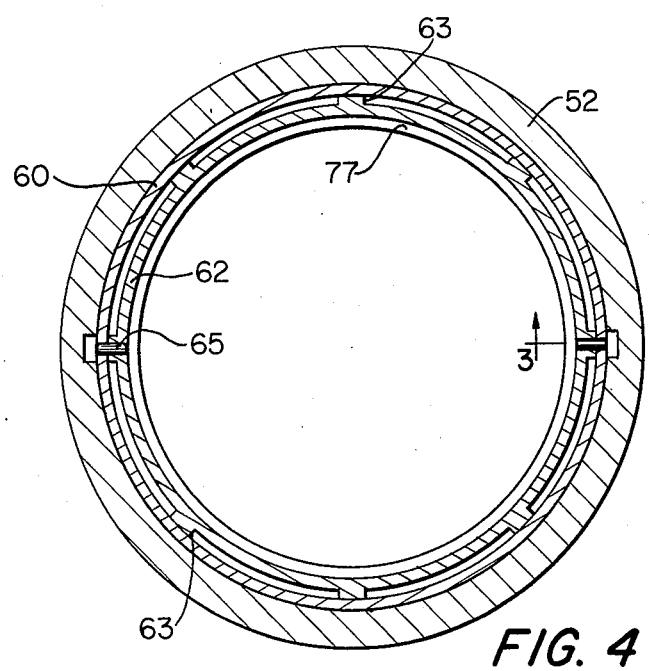
FIG. 4 is a top plan view of the crucible and die assembly of FIG. 2.
Figure 3:
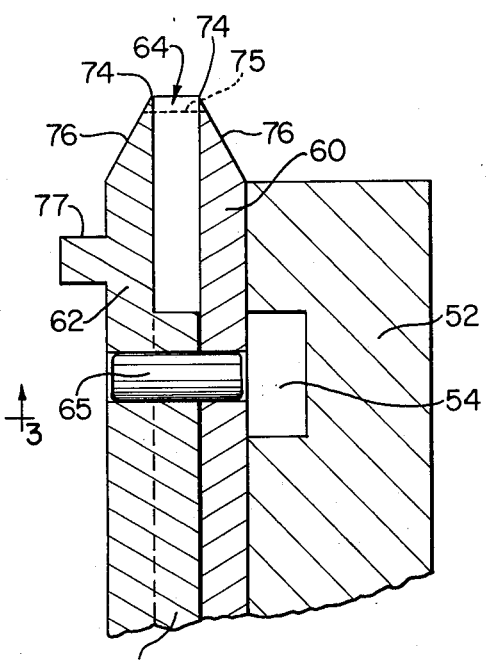
FIG. 3 is a side elevation, partly in section, on a greatly enlarged scale of a portion of the crucible and die assembly of FIG. 2.

The crucible and die arrangement shown in FIGS. 2-4 is produced as follows:

A graphite crucible 56 having an internal wall diameter of about 3.0 inches, a side wall 60 thickness of about 0.060 inches, and an internal depth of about 1.5 inches is press fitted in a molybdenum heat susceptor 44 in the manner shown in FIG. 2. A cylindrical graphite sleeve 62 having an outer wall diameter of about 2.970 inches (except at spacers 63 where the outer diameter is about 2.999 inches) and a wall thickness of about 0.090 inches (except at spacers 63 where the wall thickness is about 0.118 inches), is press fitted into crucible 56 and secured thereto by graphite pins 65. The top end surfaces of crucible 56 and sleeve 62 are bevelled as shown in FIG. 2. The resulting crucible and die is charged with substantially pure silicon and a monocrystalline silicon tube is grown according to the EFG method by drawing the tube from a film of melt which extends across over and between the upper end edge surfaces 74 and communicates with the melt in slot 64. The molten silicon in the crucible is maintained at a temperature of about 30° C. above its melting point and the temperature at the upper end of the die is kept at a temperature of about 20° C. above the melting point. Once growth has commenced, the pulling speed is held at about 1.7 inches per minute. Growth continues until substantially all the silicon within the crucible 56 is consumed.

It is to be appreciated that heat susceptors as shown at 52 are not essential to practice the present invention except where the crucible die assemblies are designed for and intended to be used in furnaces employing RF heating. Hence the susceptor may be omitted where electrical resistance heaters are used to supply heat to the crucible to form and maintain a melt from which crystalline bodies are to be grown. However, it also is contemplated that where electrical resistance heating is employed a member made like susceptor 52 may be used solely for the purpose of supporting the crucible, in which case the member would be made of a material which is not a heat susceptor, e.g., quartz. Of course, other means could also be used to support the crucible in a furnace.

It is to be understood also that the term "substantially monocrystalline" as used herein is intended to embrace a crystalline body that is comprised of a single crystal or two or more crystals, e.g. a bicrystal or tricrystal, growing together longitudinally but separated by a relatively small angle (i.e. less than about 4°) grain boundary.

What is claimed is:

1. Apparatus for use in a system for growing crystalline bodies of selected shape from a melt which is delivered from a crucible to a liquid/solid growth interface by a capillary die, said apparatus comprising a crucible and capillary die combination in which (1) at least a part of the die is an integral portion of the crucible and (2) the crucible is an essential portion of the die, said crucible being (a) open at its top end, (b) closed at its bottom end and (c) having a side wall defining an interior space for containing a melt, said crucible side wall (i) having an upper end defining at least one edge surface of the die, said side wall (ii) also forming one boundary surface of at least one capillary space which has one end communicating with said interior space and the other end terminating at said upper end.

2. Apparatus according to claim 1 wherein said crucible and die consists essentially of a single member, and further including at least one passageway of capillary dimensions formed in said crucible side wall.

3. Apparatus according to claim 2 including a cavity formed in the upper end of said crucible side wall and communicating with said at least one passageway.

4. Apparatus according to claim 3 wherein said crucible side wall is essentially cylindrical, and said cavity extends circumferentially of said crucible side wall.

5. Apparatus according to claim 1 further including a heat susceptor for containing said crucible and die.

6. Apparatus according to claim 2 wherein said passageways comprise slots formed in said crucible side wall.

7. Apparatus according to claim 1, wherein said crucible consists of an open ended cylinder, and further including a liner for closing off the crucible bottom end of said crucible.

8. Apparatus according to claim 7 for use in a system for growing crystalline bodies of silicon, wherein said crucible and die are formed of graphite and said liner is formed of quartz.

9. Apparatus for use in a system for growing crystalline bodies of selected shape from a melt which is delivered from a crucible to a liquid/solid growth interface by a capillary die, said apparatus comprising a crucible member which is an essential portion of the die, and a die-completing liner member supported interiorly of and in spaced relation to said crucible member, said crucible member and said die-completing liner member forming (1) at least one capillary passageway between the two of them and (2) an end surface configuration corresponding to said selected shape.

10. Apparatus according to claim 9 wherein said crucible member and said die-completing liner member are concentric with one another.

11. Apparatus according to claim 9 wherein said liner member and said crucible member have sharp end edge surfaces.

* * * * *